US006198283B1

(12) United States Patent
Foo et al.

(10) Patent No.: US 6,198,283 B1
(45) Date of Patent: *Mar. 6, 2001

(54) SYSTEM AND METHOD OF PHASE SENSITIVE MRI RECONSTRUCTION USING PARTIAL K-SPACE DATA AND INCLUDING A NETWORK

(75) Inventors: Thomas K. F. Foo, Rockville, MD (US); Jason A. Polzin, Lake Mills, WI (US)

(73) Assignee: GE Medical Systems Global Technology LLC, Waukesha, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/473,243

(22) Filed: Dec. 27, 1999

Related U.S. Application Data

(63) Continuation-in-part of application No. 09/154,673, filed on Sep. 18, 1998.

(51) Int. Cl.[7] ................................................. G01R 33/20
(52) U.S. Cl. ............................................. 324/309; 324/307
(58) Field of Search ..................................... 324/309, 307, 324/318, 322; 348/521; 358/403; 600/407; 705/2

(56) References Cited

U.S. PATENT DOCUMENTS

| 5,243,284 | * | 9/1993 | Noll | ..................................... 324/309 |
|---|---|---|---|---|
| 5,321,520 | * | 6/1994 | Inga et al. | ............................ 358/403 |
| 5,367,337 | * | 11/1994 | Pyle et al. | ............................ 348/521 |
| 5,602,934 | * | 2/1997 | Li et al. | ................................ 382/128 |
| 5,729,140 | * | 3/1998 | Kruger et al. | ........................ 324/309 |
| 5,740,801 | * | 4/1998 | Branson et al. | .................. 128/653.1 |
| 5,867,821 | * | 2/1999 | Ballantyne et al. | ..................... 705/2 |

OTHER PUBLICATIONS

Noll, Douglas C. et al., Homodyne Detection in Magnetic Resonance Imaging, IEEE Transactions on Medical Imaging, vol. 10, No. 2, Jun. 1991, pp. 154–163.

* cited by examiner

Primary Examiner—Christine Oda
Assistant Examiner—Tiffany A. Fetzner
(74) Attorney, Agent, or Firm—Cook & Franke, S.C.; Timothy J. Ziolkowski; Christian G. Cabou

(57) ABSTRACT

A system to correct edge blurring in an image reconstructed with partial k-space data includes a magnetic resonance imaging system, a computer, and a network. The magnetic resonance imaging system has a plurality of gradient coils positioned about a bore of a magnet to impress a polarizing magnetic field and an RF transceiver system and an RF modulator controlled by a pulse control module to transmit RF signals to an RF coil assembly to acquire MR images. The computer is programmed to: acquire a partial k-space data set having both magnitude and phase information; filter the partial k-space data set through high and low-pass filters and a linear combination of both the high and low-pass filters; Fourier transform the filtered data set; estimate a blurring correction factor representative of a convolution error term from a portion of the filtered data set; and apply the blurring correction factor to the filtered data set to remove the convolution error term and reconstruct an MRI preserving both magnitude and phase information while minimizing edge blurring in the reconstructed MRI. The network is coupled to any one of the magnetic resonance imaging system and the computer. The network provides communication with a remote facility for remote services.

27 Claims, 7 Drawing Sheets

SYSTEM AND METHOD OF PHASE SENSITIVE MRI RECONSTRUCTION USING PARTIAL K-SPACE DATA AND INCLUDING A NETWORK

CROSS-REFERENCE TO RELATED APPLICATIONS

This application is a continuation-in-part (CIP) of United States patent application Ser. No. 09/154,673, entitled "System And Method Of Phase Sensitive MRI Reconstruction Using Partial K-Space Data" by Foo, et al. filed on Sep. 18, 1998.

BACKGROUND OF THE INVENTION

The present invention relates generally to the field of medical diagnostic systems, such as imaging systems. More particularly, the invention relates to a system and technique for phase sensitive MRI reconstruction using partial k-space data to minimize data acquisition time (TE) while preserving phase information and reducing edge blurring in the reconstructed image.

In magnetic resonance (MR) imaging, the scan time can be reduced by using a partial NEX, or alternatively, the echo time can be reduced by using a fractional echo. This moves the time to the echo peak closer to the start of the read-out gradient waveform than in a full echo. However, in all partial echo or half-Fourier reconstruction strategies, all phase information is lost. The present invention is a method and system for using the homodyne reconstruction algorithm to generate a complex-valued image from which phase information can be extracted.

In general, the synthesis of the missing k-space data assumes that the MR data is Hermitian for a real-valued image. That is:

$$F(-k_x)=F^*(k_x) \quad [1]$$

where the * denotes a complex conjugate. If the k-space is divided into 4 quadrants, the data for at least two of the four quadrants is needed in order to generate an image. Therefore, either a partial echo (partially filled $k_x$) or partial NEX (partially filled $k_y$) can be used, but not both.

The following background is a review of the prior art homodyne method. If $f(x)$ is the real-valued image and $\phi(x)$ is the spatially varying phase in the image, the expression for the complex valued image can be written as:

$$I(x)=f(x)\exp(j\phi(x))=f_L(x)\exp(j\phi_L(x))+f_H(x)\exp(j\phi_H(x)). \quad [2]$$

This expression is a linear combination of the Fourier transforms of the low-pass and high-pass filtered k-space data, respectively. In homodyne reconstruction, the phase is assumed to be slowly varying and that $\phi_L(x) \approx \phi_H(x)$. Therefore, if only one-half of the high-pass filtered data is available, this is equivalent to multiplying the high-pass filtered data by a Heaviside function such that the resulting image is given by:

$$I_H(x) = f_L(x)\exp(j\phi_L(x)) + f_H(x)\exp(j\phi_L(x)) \otimes \frac{1}{2}\left(\delta(x)+\frac{1}{j\pi x}\right), \quad [3]$$

where $\otimes$ denotes a convolution. Since the convolution term decays with 1/x and that the phase is slowly varying, Eqn. [3] can be rewritten as:

$$I_H(x) \approx \left(f_L(x)\frac{1}{2}f_H(x) - \frac{j}{2}f_H(x) \otimes \frac{1}{\pi x}\right)\exp(j\phi_L(x)). \quad [4]$$

If the available high frequency data is weighted by 2, Eqn. [4] can be written as:

$$I_H(x) = \left(f_L(x) + f_H(x) - jf_H(x) \otimes \frac{1}{\pi x}\right)\exp(j\phi_L(x)). \quad [5]$$

If the spatially varying phase term is divided out, the image is then the real-valued part of $I_H(x) \exp(-j\phi_L(x))$, i.e.:

$$f_L(x)+f_H(x)=f(x)=\text{Re}(I_H(x)\exp(-j\phi_L(x))), \quad [6]$$

where the spatially varying phase is estimated from the phase of the Fourier transform of the low-pass filtered data. It is noted that in Eqn. [6], all phase information has now been lost. Note that Eqn. [6] could easily be written as $f(x)=\text{Re}(I_H(x))e^{-j\phi^L(x)}$ where the phase in the image is the low spatial frequency phase. However, this phase is only an estimate and is of little use. Hence, this technique is not suitable for phase contrast reconstruction. Furthermore, the loss of phase information requires that the Fourier transform in the y direction be performed first, before the homodyne reconstruction is applied to the data in the x direction.

It would therefore be desirable to have a system and method capable of preserving magnitude and phase information in a partially acquired k-space data set that allows reduced data acquisition times and significantly improves edge blurring in the reconstructed MR image.

Solutions to the problems described above have not heretofore included significant remote capabilities. In particular, communication networks, such as, the Internet or private networks, have not been used to provide remote services to such medical diagnostic systems. The advantages of remote services, such as, remote monitoring, remote system control, immediate file access from remote locations, remote file storage and archiving, remote resource pooling, remote recording, remote diagnostics, and remote high speed computations have not heretofore been employed to solve the problems discussed above.

Thus, there is a need for a medical diagnostic system which provides for the advantages of remote services and addresses the problems discussed above. In particular, there is a need for providing the ability to remotely view images by an off-site expert. Further, there is a need for the ability to perform upgrades of correction factors and algorithms from a remote facility. Even further, there is a need to apply the correction factor during reconstruction, also via a remote facility.

SUMMARY OF THE INVENTION

One embodiment of the invention relates to a system to correct edge blurring in an image reconstructed with partial k-space data including a magnetic resonance imaging system, a computer, and a network. The magnetic resonance imaging system has a plurality of gradient coils positioned about a bore of a magnet to impress a polarizing magnetic field and an RF transceiver system and an RF modulator controlled by a pulse control module to transmit RF signals to an RF coil assembly to acquire MR image. The computer is programmed to: acquire a partial k-space data set having both magnitude and phase information; filter the partial k-space data set through high and low-pass filters and a linear combination of both the high and low-pass filters;

Fourier transform the filtered data set; estimate a blurring correction factor representative of a convolution error term from a portion of the filtered data set; and apply the blurring correction factor to the filtered data set to remove the convolution error term and reconstruct an MRI preserving both magnitude and phase information while minimizing edge blurring in the reconstructed MRI. The network is coupled to any one of the magnetic resonance imaging system and the computer. The network provides communication with a remote facility for remote services.

Another embodiment of the invention relates to in a magnetic resonance imaging system, a method of phase sensitive magnetic resonance image (MRI) reconstruction using partial k-space data. The method includes acquiring a partial k-space data set having both imaginary and real components containing both magnitude and phase information; communicating at least the partial k-space data set to a remote facility to provide remote services; filtering the partial k-space data set through high and low-pass filters and a linear construction of both; Fourier transforming the filtered data set; estimating a blurring correction factor representative of a convolution error term from a portion of the filtered data set; applying the blurring correction factor to the filtered data set to remove the convolution error term; and reconstructing an MRI having both magnitude and phase information thereby minimizing edge blurring in the reconstructed MRI.

Another embodiment of the invention relates to a system for minimizing edge blurring in a reconstructed magnetic resonance image (MRI) using partial k-space data. The system includes means for acquiring partial k-space data containing both magnitude and phase components; means for communicating the partial k-space data to a remote facility to provide remote services; means for partially calculating a homodyne reconstructed MRI; means for retaining the phase component in the partially calculated homodyne reconstructed MRI; and means for removing a blurring error factor from the partially calculated homodyne reconstructed MRI having both the phase component and a magnitude component therein with reduced MRI edge blurring.

Other principle features and advantages of the present invention will become apparent to those skilled in the art upon review of the following drawings, the detailed description, and the appended claims.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENT

Figure 1:
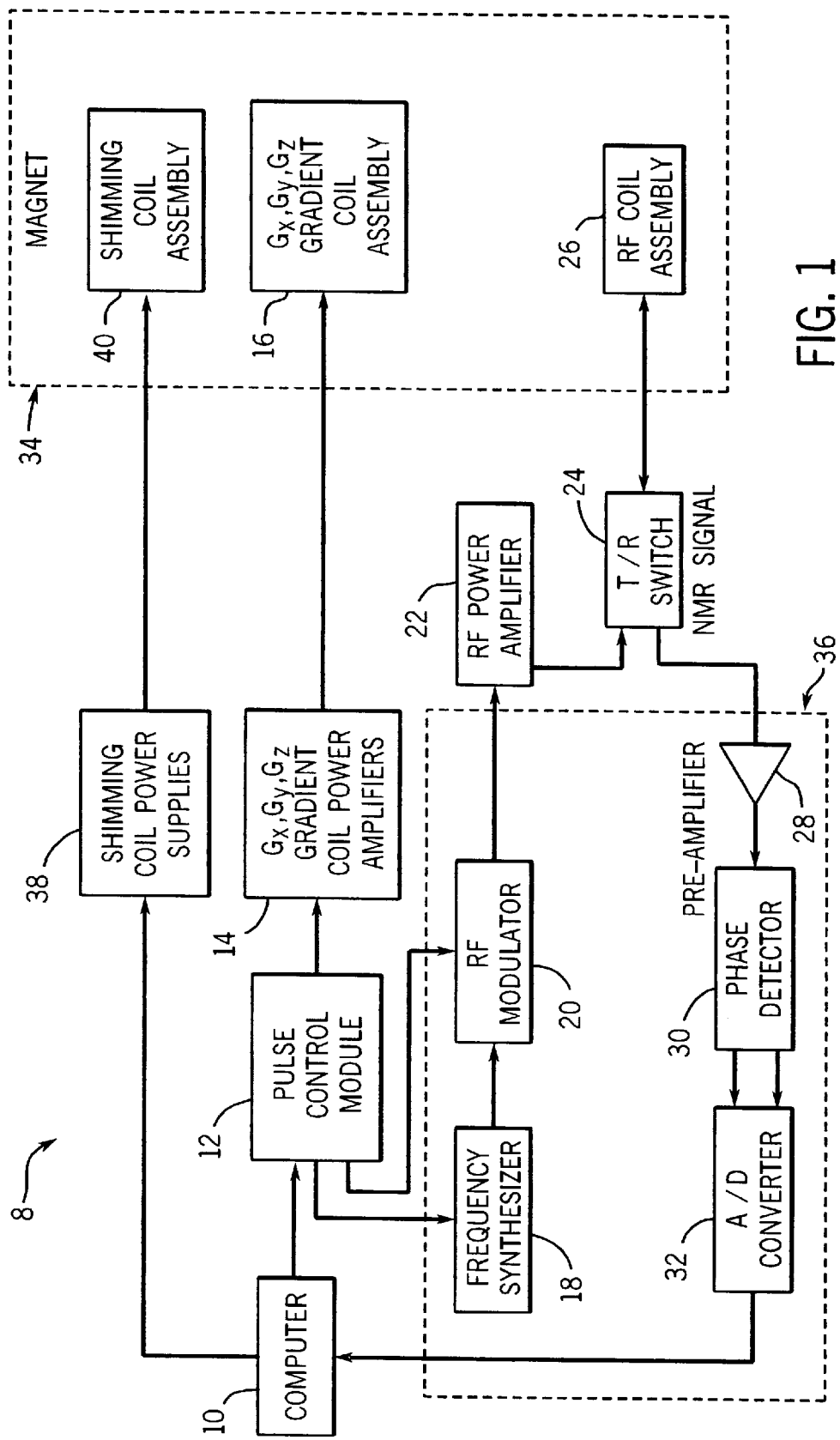
FIG. 1 is a schematic block diagram of an NMR imaging system for use with the presently preferred embodiment.

Referring to FIG. 1, a nuclear magnetic resonance (NMR) imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to "$G_x$, $G_y$, $G_z$ gradient coil assembly 16" which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by RF power amplifier 22 and applied to RF coil assembly 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object. Computer 10 also controls shimming coil power supplies 38 to power shimming coil assembly 40.

Figure 2:
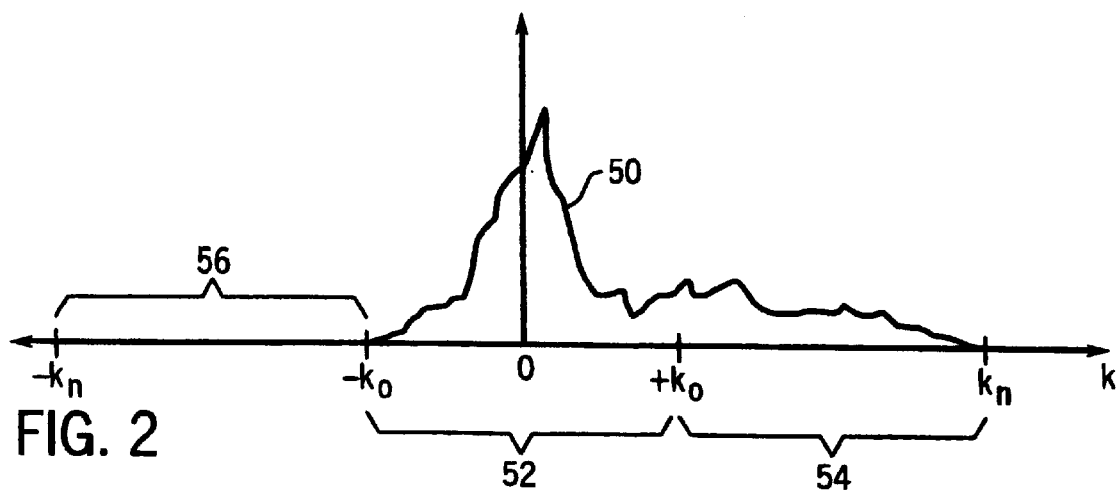
FIG. 2 is a graphical representation of a partial k-space data acquisition.

The present invention includes a method and system suitable for use with the above-referenced NMR system, or any similar or equivalent system for obtaining MR k-space data for use in reconstructing MR images. The present invention includes acquiring partial k-space data having both imaginary and real components containing representations of both the magnitude and phase of the partial k-space data. FIG. 2 shows a graph of an exemplary partial k-space data set 50 in which data is present from $-k_0$ through $+k_0$ in the low frequency domain 52, and from $+k_0$ through $k_n$ in the high frequency 54 domain. This exemplary data set was acquired through either a partial echo or a partial NEX to allow for reduced echo time (TE) or scan time. As a result, high frequency data is absent for half of the k-space high frequency domain 56 from $-k_0$ through $-k_n$.

To more accurately represent the MR image, it is desirable to fill in the missing data points between $-k_0$ through $-k_n$. In typical phase contrast acquisitions, a partial echo is commonly used to minimize the sequence TE time and improve the S/N of the vascular signal. However, to avoid image blurring, it is desirable to use a high fractional echo typically of the order of 75% to 80% of a full echo. In order to retain phase information, image reconstruction is a zero-filled Fourier transform of the frequency-encoded data.

The image of the zero-filled data can be written as $$I_z(x) = f_L(x)\exp(j\phi_L(x)) + \frac{1}{2}f_H(x)\exp(j\phi_L(x)) - \frac{j}{2}f_H(x)\exp(j\phi_L(x)) \otimes \frac{1}{\pi x}. \quad [7]$$

Even if a sufficiently high echo fraction is used, the image will suffer from blurring as the result of inadequately weighted high spatial frequency information and from the convoluting function.

The problem with this approach is it cannot minimize the TE and preserve the phase information without incurring penalties to image quality. If a high partial echo fraction is acquired, as used with the previously described zero-filled data, and that the phase is assumed to be slowly varying, the phase term can be pulled out and the result is given by:

$$I_z(x) \approx \left(f_L(x) + \frac{1}{2}f_H(x) - \frac{j}{2}f_H(x) \otimes \frac{1}{\pi x}\right)\exp(j\phi_L(x)). \quad [8]$$

Next, the same weighting factors are applied as in the homodyne reconstruction algorithm, that are given by:

$$W_H(k) = \begin{cases} 0, & k < -k_0 \\ 1, & -k_0 \leq K \leq k_0 \\ 2, & k > +k_0 \end{cases} \quad [9a]$$

$$W_L(k) = \begin{cases} 1, & -k_0 \leq k \leq k_0 \\ 0, & \text{otherwise} \end{cases} \quad [9b]$$

Figure 3:
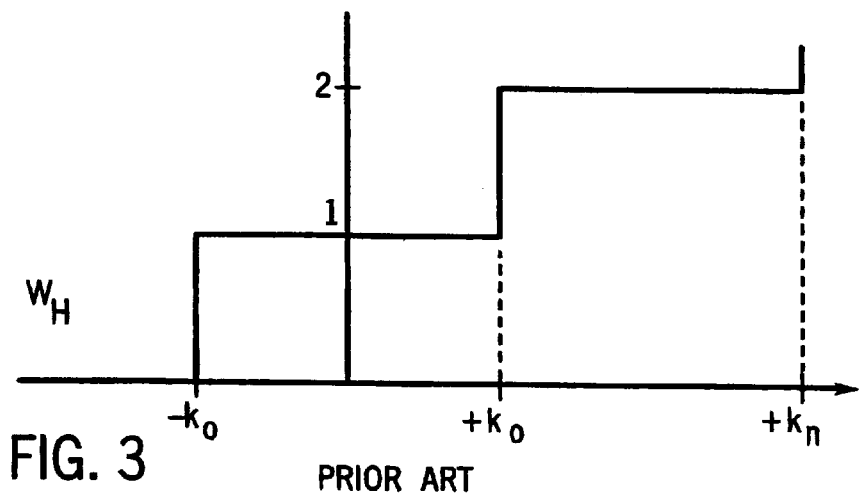
FIG. 3 is a graphical representation of a step filter for use with the partial k-space data of FIG. 2.

Referring to FIG. 3, a step filter $W_H$, is applied to the data of FIG. 2. That is, for k-space data between $-k_0$ and $+k_0$, the low-pass filter adjusts the data to a value of 1, and for the k-space outside of the low frequency domain 52 it sets the data value to zero, except for the region $+k_0$ to $+k_n$ where the weight is set to a value of 2. If this filter is applied to the acquired k-space data, Eqn. [8] can be written as:

$$I_c(x) \approx \left(f_L(x) + f_H(x) - jf_H(i) \otimes \frac{1}{\pi x}\right)\exp(j\phi_L(x)). \quad [10]$$

Figure 6:
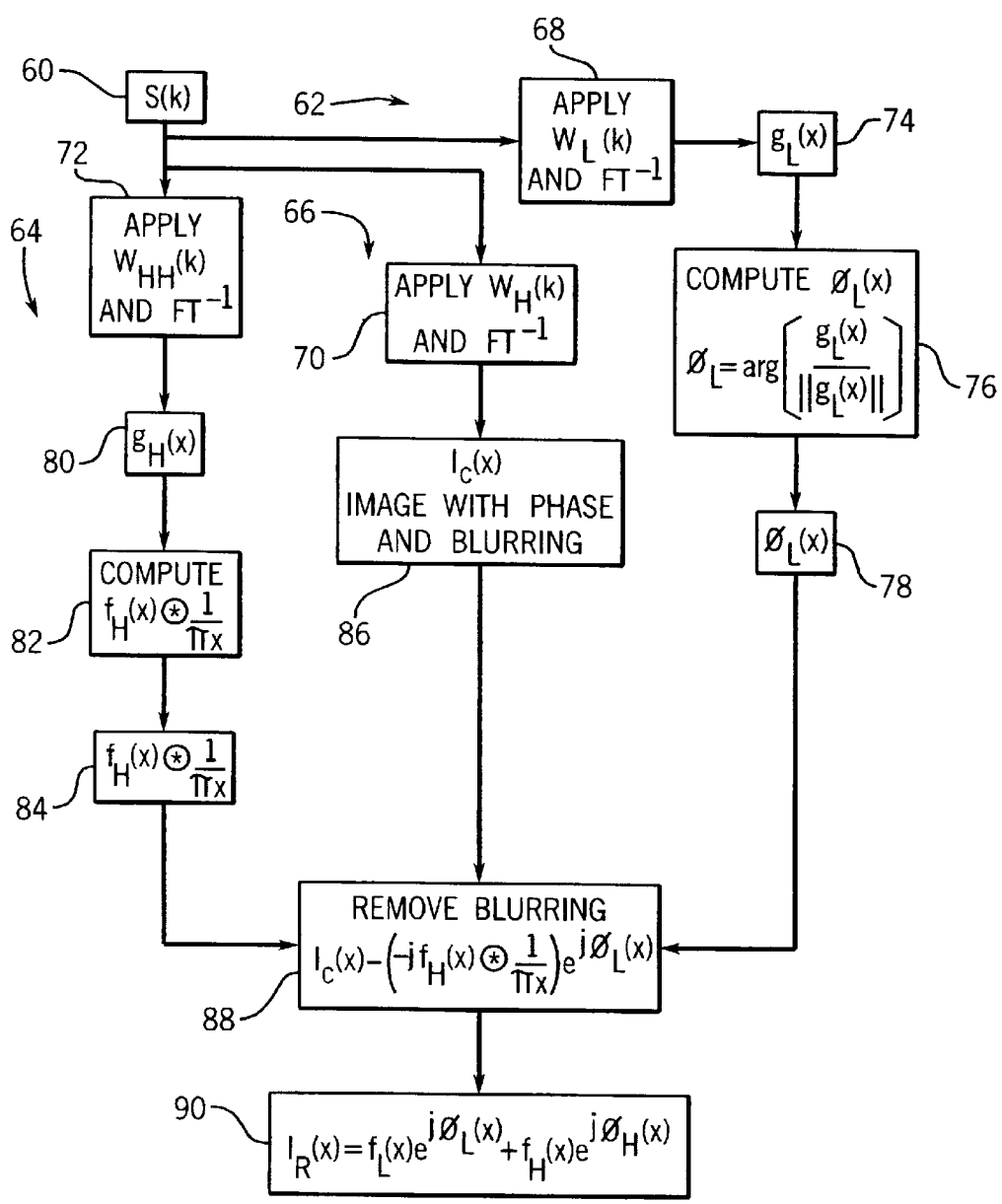
FIG. 6 is a flow chart of a portion of the system and method of the presently preferred embodiment.

Although Eqn. [10] is a better approximation than Eqn. [8], in order to remove the phase variation caused by the convolution term, $$jf_H(i) \otimes \frac{1}{\pi x},$$

additional steps are required. In a preferred embodiment, the following described algorithm is performed in parallel as shown in, and referenced to, FIG. 6. After acquiring a partial k-space data set 60, the system is programmed to parallel process the following algorithm along at least three pre-defined subroutines 62, 64, and 66. Each of the subroutines include an initial filtering and Fourier transforming step 68, 70 and 72.

Figure 4:
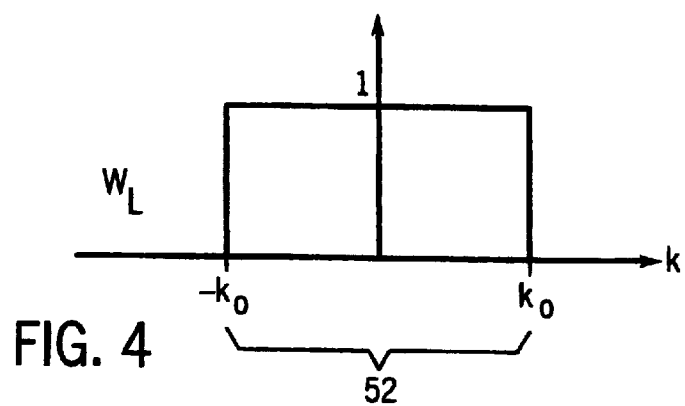
FIG. 4 is a graphical representation of the partial k-space data of FIG. 2 after filtered through a low-pass filter in accordance with one aspect of the preferred embodiment.

The first subroutine 62 next involves estimating the low-passed filtered spatially-varying phase as:

$$\exp(j\phi_L(x)) = \frac{g_L(x)}{\|g_L(x)\|}, \quad [11]$$

where $g_L(x)$ 74 is the complex-valued Fourier transform of the low-pass filtered k-space data from $[-k_0 \ldots +k_0]$, using the weighting function of FIG. 4. The computation 76 results in an estimation of the phase $\phi$ at 78.

Figure 5:
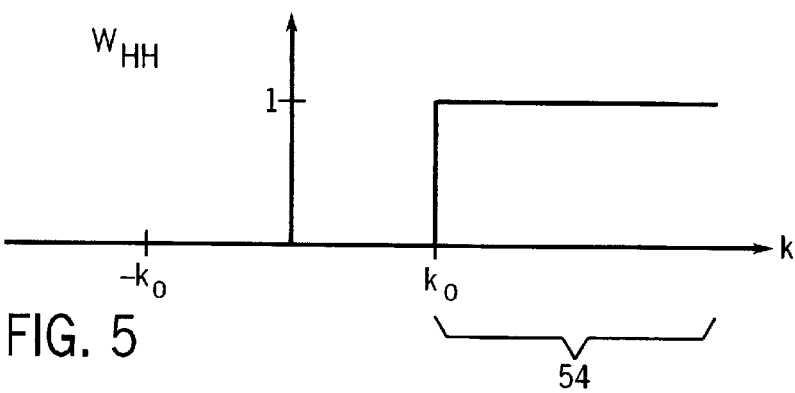
FIG. 5 is a graphical representation of the partial k-space data of FIG. 2 after filtered through a high-pass filter in accordance with one aspect of the preferred embodiment.

The next subroutine 64, after filtering and transforming 72, includes estimating the blurring correction factor at 82 from the convolution term. If $g_H(x)$ 80 is the complex-valued Fourier transform of the filtered k-space data, $f(k) \cdot W_{HH}(k)$ of FIG. 5, where $$W_{HH}(k) = \begin{cases} 0, & k < +k_0 \\ 1, & \text{otherwise} \end{cases} \quad [12]$$

$g_H(x)$ can them be written as:

$$g_H(x) = \frac{1}{2}\left(f_H(x) - jf_H(x) \otimes \frac{1}{\pi x}\right)\exp(j\phi_L(x)), \quad [13]$$

assuming that the phase, in the image is slowly varying. Hence the blurring from the convolution term 84 in Eqn. [8] is then twice the imaginary component of $g_H(X)$ after dividing out the phase term, $\phi_L(x)$, i.e.:

$$f_H(x) \otimes \frac{1}{\pi x} = -2 \cdot \text{Imag}\left(g_H(x)\frac{\|g_L(x)\|}{g_L(x)}\right). \quad [14]$$

After applying a weighting function, as in Eqn. [9], to the partial echo k-space data and obtain its Fourier transform 70, of the next subroutine 66, an image having phase and a blurring error 86 is generated as $I_c(x)$.

To then remove the blurring error 84, Eqn. [14] is multiplied by the low frequency phase estimate 78 and subtracted from $I_c(x)$ 86 at step 88. The result is an improved approximation of the image:

$$I_R(x) = I_C(x) + 2j \cdot \frac{g_L(x)}{\|g_L(x)\|} \cdot \text{Imag}\left(g_H(x)\frac{\|g_L(x)\|}{g_L(x)}\right). \quad [15]$$

$$= 7l_R(x)e^{j\phi^L(x)} + f_{H(x)}e^{j\phi^H(x)} \quad [15a]$$

This resultant image $I_R(X)$ 90 is a complex-valued image that retains the phase information and reduces blurring and data acquisition times.

In practice, it is desirable to have the k-space filters described in Eqns. [9] and [12] to have a much smoother transition in order to minimize the rapid changes in k-space weighting that cause edge ringing artifacts in the image. The abrupt step functions are preferably substituted with a smoothly varying fermi filter, such that Eqn. [9] is replaced with:

$$W_H(k) = 2 - \frac{1}{1 + \exp((k - k_0)/ntrans)} - \frac{1}{1 + \exp((k + k_0)/ntrans)}, \quad [16]$$

and, similarly, Eqn. [12] can be replaced with:

$$W_{HH}(k) = 1 - \frac{1}{1 + \exp((k - k_0)/ntrans)}, \quad [17]$$

where ntrans is the transition width of the fermi distribution function. This implies that the smoothed filter will have a convolution term that falls off faster than the 1/x term of Eqn. [8], for example. This will improve the conditions under which the assumption that $\phi_L(x)$ does not change substantially where the signal power for the 1/x convolution term is significant.

Accordingly, the presently preferred embodiment includes a method of phase sensitive MRI reconstruction using partial k-space data including the steps of acquiring a partial k-space data set having both imaginary and real components containing both magnitude and phase information and filtering the partial k-space data set through high and low-pass filters, and Fourier transforming the filtered data set. The method next includes estimating a blurring correction factor representative of a convolution error term from a portion of the filtered data set and applying the blurring correction factor to the filtered data set to remove the convolution error term and reconstruct an MRI having both magnitude and phase set information thereby minimizing edge blurring in the reconstructed MRI. Preferably, the partial k-space data set is acquired in the range of approximately 75% to 80% of a full MRI. The method is further defined as calculating a low frequency spatial phase and applying the blurring correction factor to the filtered data set to remove the convolution error term.

The system of the presently preferred embodiment is designed to correct edge blurring in an image reconstructed with partial k-space data obtained from a magnetic resonance imaging system such as that shown in FIG. 1. The system includes a computer programmed to accomplish the foregoing steps.

A system is shown to correct edge blurring in an image reconstructed with partial k-space data. The system includes a magnetic resonance imaging system having a number of gradient coils positioned about a bore of a magnet to impress a polarizing magnetic field and an RF receiver system and an RF modulator controlled by a pulse control module to transmit RF signals to an RF coil assembly to acquire MR images. The system includes a computer programmed to acquire only a partial k-space data set having both magnitude and phase information. The program also filters the partial k-space data set through high and low-pass filters and Fourier transforms the filtered data set. Next, a blurring correction factor is estimated from a portion of the filtered data set and applied to the filtered data set to remove a convolution error term and reconstruct an MRI having both magnitude and phase information thereby minimizing data acquisition time and edge blurring in the reconstructed MRI.

The preferred embodiment includes a system for minimizing edge blurring in a reconstructed MRI using partial k-space data having a means for acquiring partial k-space data containing both magnitude and phase components, a means for partially calculating a homodyne reconstructed MRI, and a means for retaining the phase components in the partially calculated homodyne reconstructed MRI. The system further includes a means for removing a blurring error term from the partially calculated homodyne reconstructed MRI having both the phase component and a magnitude component therein with reduced MRI edge blurring.

The preferred embodiment was tested using a full echo data set as the reference data, and reconstructing an image using only 60% of the echo. With conventional homodyne reconstruction, only a magnitude image could be obtained. However, the full echo phase image was compared to the phase reconstruction of the partial echo data, and without the use of the fermi filters of Eqns. [16]–[17], the results showed reduced blurring but with some ringing off the edges in the test image. The data reconstructed without the use of the filters of Eqns. [16]–[17], is essential data reconstructed using zero-filling.

The phase image reconstructed from a full echo data set displayed normal phase variation across the image resulting from $B_0$ inhomogeneity, as exaggerated by mis-setting the shims. The phase image using 60% of the echo of the same data set and the proposed reconstruction algorithm generated an equivalent phase image while maintaining good edge definition. When compared to a zero-filled reconstructions, the same phase information is retained together with a reduction in the ringing off the edges.

Figure 7:
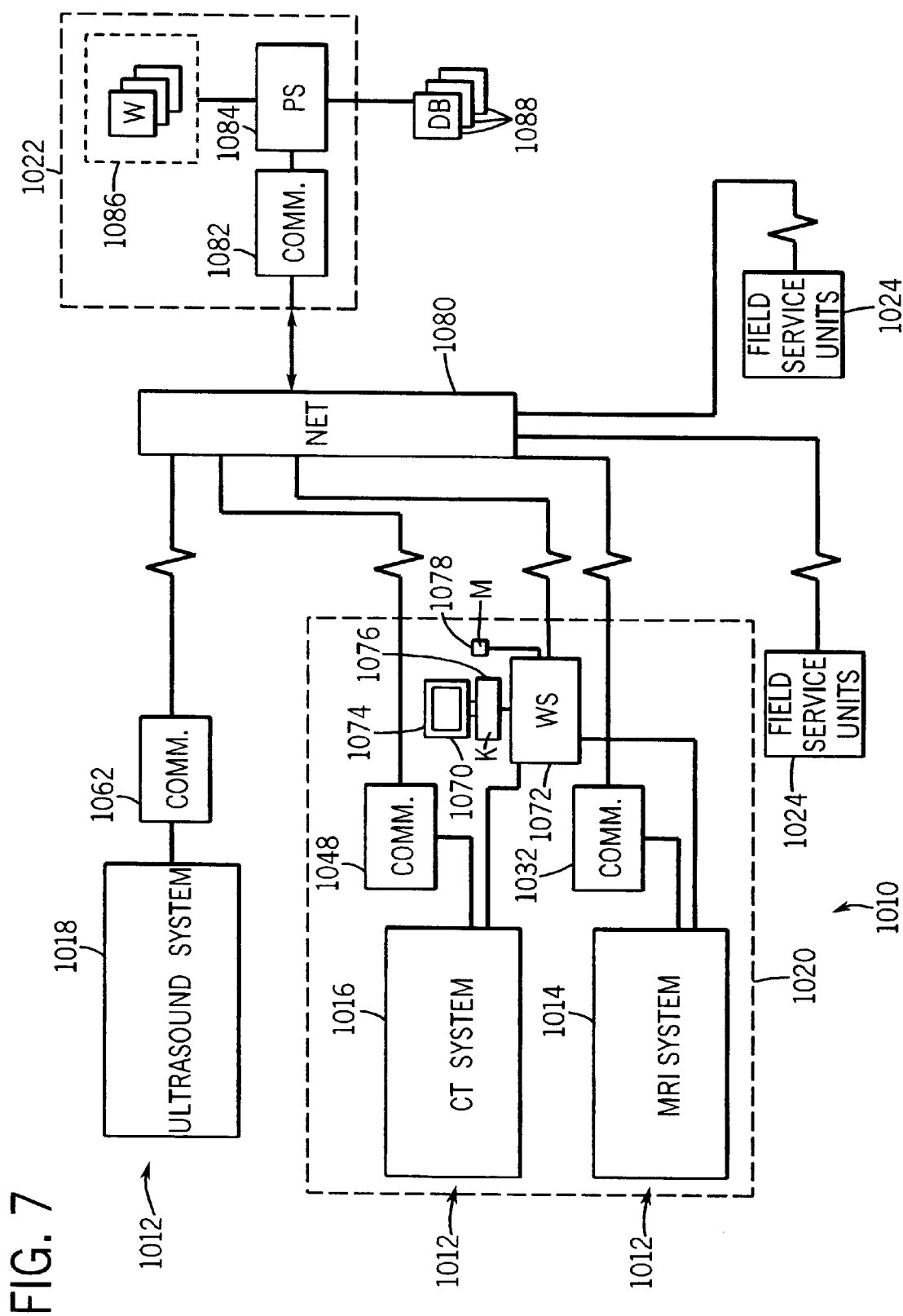
FIG. 7 is a diagrammatical representation of a series of medical diagnostic systems coupled to a service facility via a network connection for providing remote services and data interchange between the diagnostic systems and the service facility.

Referring now to FIG. 7, a service system 1010 is illustrated for providing remote service to a plurality of medical diagnostic systems 1012, including systems such as the MR imaging system described with reference to FIG. 1. In the embodiment illustrated in FIG. 7, the medical diagnostic systems include a magnetic resonance imaging (MRI) system 1014, a computed tomography (CT) system 1016, and an ultrasound imaging system 1018. The diagnostic systems may be positioned in a single location or facility, such as a medical facility 1020, or may be remote from one another as shown in the case of ultrasound system 1018. The diagnostic systems are serviced from a centralized service facility 1022. Moreover, a plurality of field service units 1024 may be coupled in the service system for transmitting service requests, verifying service status, transmitting service data and so forth as described more fully below.

In the exemplary embodiment of FIG. 7, several different system modalities are provided with remote service by the service facility. Remote services include but are not limited to services, such as, remote monitoring, remote system control, immediate file access from remote locations, remote file storage and archiving, remote resource pooling, remote recording, and remote high speed computations. Remote services are provided to a particular modality depending upon the capabilities of the service facility, the types of diagnostic systems subscribing to service contracts with the facility, as well as other factors.

Depending upon the modality of the systems, various subcomponents or subsystems will be included. In the case of MRI system 1014, such systems will generally include a scanner, a control and signal detection circuit, a system controller, and an operator station. MRI system 1014 includes a uniform platform for interactively exchanging service requests, messages and data with service facility 1022 as described more fully below. MRI system 1014 is linked to a communications module 1032, which may be included in a single or separate physical package from MRI system 1014. In a typical system, additional components may be included in system 1014, such as a printer or photographic system for producing reconstructed images based upon data collected from the scanner.

Similarly, CT system 1016 will typically include a scanner, a signal acquisition unit, and a system controller. The scanner detects portions of x-ray radiation directed through a subject of interest. The controller includes circuitry for commanding operation of the scanner and for processing and reconstructing image data based upon the acquired signals. CT system 1016 is linked to a communications module 1048 for transmitting and receiving data for remote services. Moreover, like MRI system 1014, CT system 1016 will generally include a printer or similar device for outputting reconstructed images based upon data collected by the scanner.

In the case of ultrasound system 1018, such systems will generally include a scanner and data processing unit and a system controller. Ultrasound system 1018 is coupled to a communications module 1062 for transmitting service requests, messages and data between ultrasound system 1018 and service facility 1022.

Although reference is made herein generally to "scanners" in diagnostic systems, that term should be understood to include medical diagnostic data acquisition equipment generally, not limited to image data acquisition, as well as to picture archiving communications and retrieval systems, image management systems, facility or institution management systems, viewing systems and the like, in the field of medical diagnostics.

Where more than one medical diagnostic system is provided in a single facility or location, as indicated in the case of MRI and CT systems 1014 and 1016 in FIG. 7, these may be coupled to a management station 1070, such as in a radiology department of a hospital or clinic. The management station may be linked directly to controllers for the various diagnostic systems. The management system may include a computer workstation or personal computer 1072 coupled to the system controllers in an intranet configuration, in a file sharing configuration, a client/server arrangement, or in any other suitable manner. Moreover, management station 1070 will typically include a monitor 1074 for viewing system operational parameters, analyzing system utilization, and exchanging service requests and data between the facility 1020 and the service facility 1022. Input devices, such as a standard computer keyboard 1076 and mouse 1078, may also be provided to facilitate the user interface.

It should be noted that, alternatively, the management system, or other diagnostic system components, may be "stand-alone" or not coupled directly to a diagnostic system. In such cases, the service platform described herein, and some or all of the service functionality nevertheless be provided on the management system. Similarly, in certain applications, a diagnostic system may consist of a stand-alone or networked picture archiving communications and retrieval system or a viewing station provided with some or all of the functionality described herein.

The communication modules mentioned above, as well as workstation 1072 and field service units 1024 may be linked to service facility 1022 via a remote access network 1080. For this purpose, any suitable network connection may be employed. Presently preferred network configurations include both proprietary or dedicated networks, as well as open networks, such as the Internet. Data may be exchanged between the diagnostic systems, field service units, and remote service facility 1022 in any suitable format, such as in accordance with the Internet Protocol (IP), the Transmission Control Protocol (TCP), or other known protocols. Moreover, certain of the data may be transmitted or formatted via markup languages such as the HyperText Markup Language (HTML), or other standard languages. The presently preferred interface structures and communications components are described in greater detail below.

Within service facility 1022, messages, service requests and data are received by communication components as indicated generally at reference numeral 1082. Components 1082 transmit the service data to a service center processing system, represented generally at reference numeral 1084 in FIG. 7. The processing system manages the receipt, handling and transmission of service data to and from the service facility. In general, processing system 1084 may include one or a plurality of computers, as well as dedicated hardware or software servers for processing the various service requests and for receiving and transmitting the service data as described more fully below.

Service facility 1022 also includes a bank of operator workstations 1086 which may be staffed by personnel who address the service requests and provide off and on-line service to the diagnostic systems in response to the service requests. Also, processing system 1084 may be linked to a system of databases or other processing systems 1088 at or remote from the service facility 1022. Such databases and processing systems may include extensive database information on operating parameters, service histories, and so forth, both for particular subscribing scanners, as well as for extended populations of diagnostic equipment.

Figure 8:
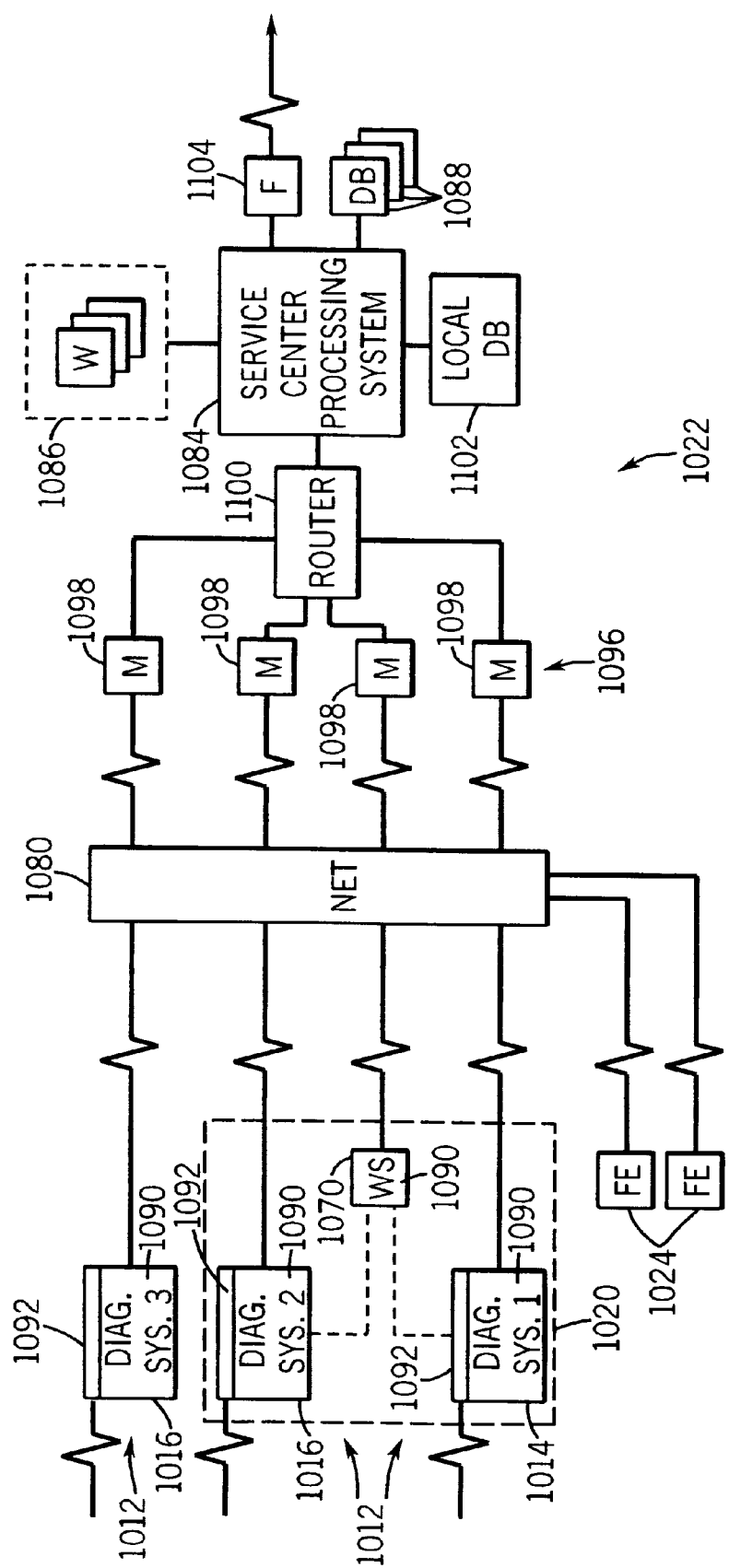
FIG. 8 is a block diagram of the systems shown in FIG. 7 illustrating certain functional components of the diagnostic systems and the service facility.

FIG. 8 is a block diagram illustrating the foregoing system components in a functional view. As shown in FIG. 8, the field service units 1024 and the diagnostic systems 1012 can be linked to the service facility 1022 via a network connection as illustrated generally at reference numeral 1080. Within each diagnostic system 1012, a uniform service platform 1090 is provided.

Platform 1090, which is described in greater detail below with particular reference to FIG. 9, includes hardware, firmware, and software components adapted for composing service requests, transmitting and receiving service data, establishing network connections and managing financial or subscriber arrangements between diagnostic systems and the service facility. Moreover, the platforms provide a uniform graphical user interface at each diagnostic system, which can be adapted to various system modalities to facilitate interaction of clinicians and radiologists with the various diagnostic systems for service functions. The platforms enable the scanner designer to interface directly with the control circuitry of the individual scanners, as well as with memory devices at the scanners, to access image, log and similar files needed for rendering requested or subscribed services. Where a management station 1070 is provided, a similar uniform platform is preferably loaded on the management station to facilitate direct interfacing between the management station and the service facility. In addition to the uniform service platform 1090, each diagnostic system is preferably provided with an alternative communications module 1092, such as a facsimile transmission module for sending and receiving facsimile messages between the scanner and remote service facilities.

Messages and data transmitted between the diagnostic systems and the service facility traverse a security barrier or "firewall" contained within processing system 1084 as discussed below, which prevents unauthorized access to the service facility in a manner generally known in the art. A modem rack 1096, including a series of modems 1098, receives the incoming data, and transmits outgoing data through a router 1100 which manages data traffic between the modems and the service center processing system 1084.

In the diagram of FIG. 8, operator workstations 1086 are coupled to the processing system, as are remote databases or computers 1088. In addition, at least one local service database 1102 is provided for verifying license and contract arrangements, storing service record files, log files, and so forth. Moreover, one or more communication modules 1104 are linked to processing system 1084 to send and receive facsimile transmissions between the service facility and the diagnostic systems or field service units.

Figure 9:
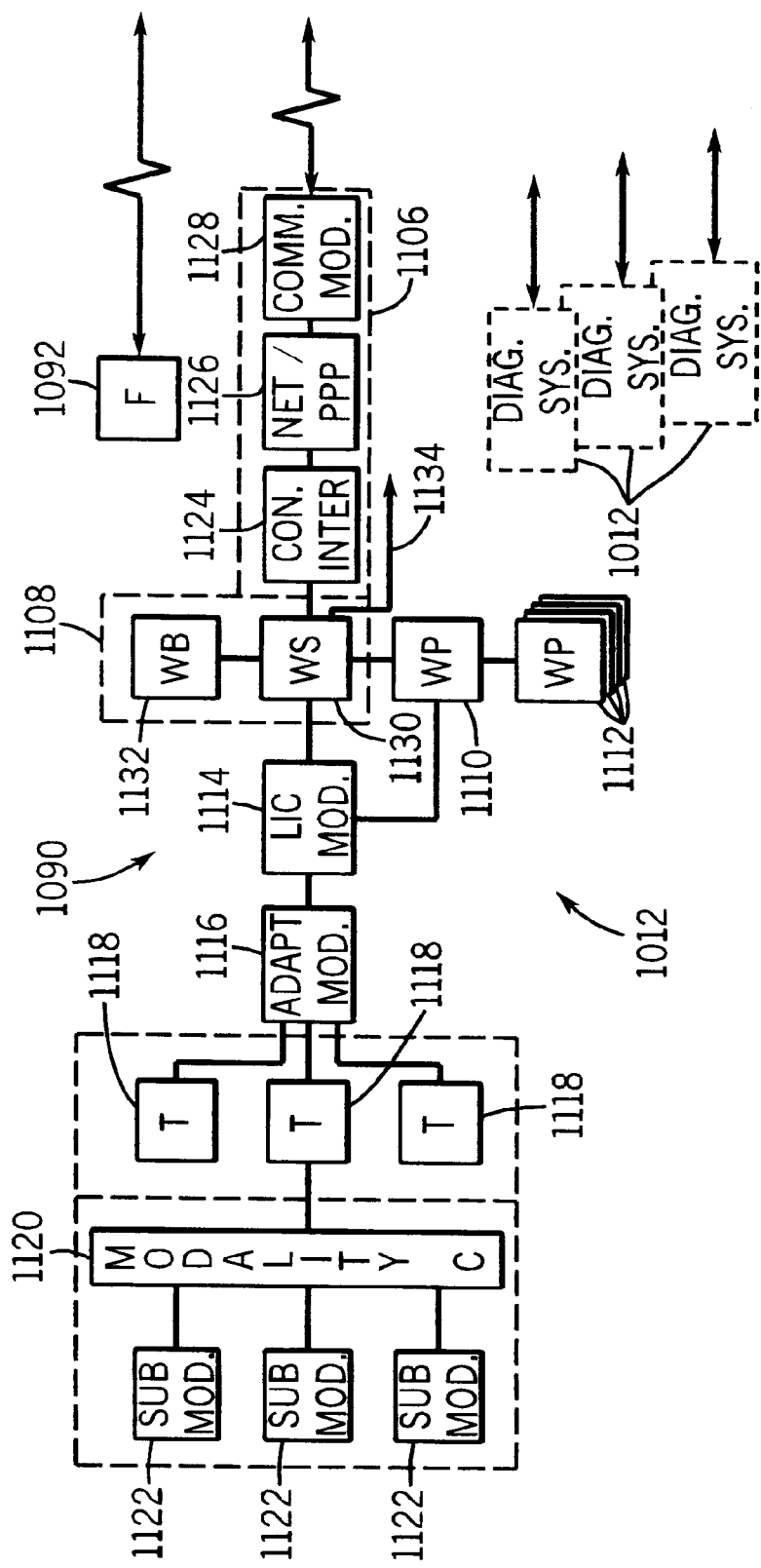
FIG. 9 is a block diagram of certain functional components within a diagnostic system of the type shown in FIG. 7 and FIG. 8 for facilitating interactive remote servicing of the diagnostic system.

FIG. 9 illustrates diagrammatically the various functional components comprising the uniform service platform 1090 within each diagnostic system 1012. As shown in FIG. 9, the uniform platform includes a device connectivity module 1106, as well as a network connectivity module 1108. Network connectivity module 1108 accesses a main web page 1110 which, as mentioned above, is preferably a markup language page, such as an HTML page displayed for the system user on a monitor at the diagnostic system. Main web page 1110 is preferably accessible from a normal operating page in which the user will configure examination requests, view the results of examinations, and so forth such as via an on-screen icon. Through main web page 1110, a series of additional web pages 1112 are accessible. Such web pages permit remote service requests to be composed and transmitted to the remote service facility, and facilitate the exchange of other messages, reports, software, protocols, and so forth as described more fully below.

It should be noted that as used herein the term "page" includes a user interface screen or similar arrangement which can be viewed by a user of the diagnostic system, such as screens providing graphical or textual representations of data, messages, reports and so forth. Moreover, such pages may be defined by a markup language or a programming language such as Java, per, java script, or any other suitable language.

Network connectivity module 1108 is coupled to a license module 1114 for verifying the status of license, fee or contractual subscriptions between the diagnostic system and the service facility. As used herein, the term "subscription" should be understood to include various arrangements, contractual, commercial or otherwise for the provision of services, information, software, and the like, both accompanies with or without payment of a fee. Moreover, the particular arrangements manages by systems as described below may include several different types of subscriptions, including time-expiring arrangements, one-time fee arrangements, and so-called "pay per use" arrangements, to mention but a few.

License module 1114 is, in turn, coupled to one or more adapter utilities 1116 for interfacing the browser, server, and communications components with modality interface tools 1118. In a presently preferred configuration, several such interface tools are provided for exchanging data between the system scanner and the service platform. For example, modality interface tools 1118 may include applets or servlets for building modality-specific applications, as well as configuration templates, graphical user interface customization code, and so forth. Adapters 1116 may interact with such components, or directly with a modality controller 1120 which is coupled to modality-specific subcomponents 1122.

The modality controller 1120 and modality-specific subcomponents 1122 will typically include a preconfigured processor or computer for executing examinations, and memory circuitry for storing image data files, log files, error files, and so forth. Adapter 1116 may interface with such circuitry to convert the stored data to and from desired protocols, such as between the HyperText Transfer Protocol (HTTP) and DICOM, a medical imaging standard for data presentation. Moreover, transfer of files and data as described below may be performed via any suitable protocol, such as a file transfer protocol (FTP) or other network protocol.

In the illustrated embodiment, device connectivity module 1106 includes several components for providing data exchange between the diagnostic system and the remote service facility. In particular, a connectivity service module 1124 provides for interfacing with network connectivity module 1108. A Point-to-Point Protocol (PPP) module 1126 is also provided for transmitting Internet Protocol (IP) packets over remote communication connections. Finally, a modem 1128 is provided for receiving and transmitting data between the diagnostic system and the remote service facility. As will be appreciated by those skilled in the art, various other network protocols and components may be employed within device connectivity module 1106 for facilitating such data exchange.

Network connectivity module 1108 preferably includes a server 1130 and a browser 1132. Server 1130 facilitates data exchange between the diagnostic system and the service facility, and permits a series of web pages 1110 and 1112 to be viewed via browser 1132. In a presently preferred embodiment, server 1130 and browser 1132 support HTTP applications and the browser supports java applications. Other servers and browsers, or similar software packages may, of course, be employed for exchanging data, service requests, messages, and software between the diagnostic system, the operator and the remote service facility. Finally, a direct network connection 1134 may be provided between server 1130 and an operator workstation, such as management station 1070 within the medical facility (see FIGS. 7 and 8).

In a present embodiment, the components comprising network connectivity module may be configured via an application stored as part of the uniform platform. In particular, a Java application licensed to a service engineer enables the engineer to configure the device connectivity at the diagnostic system to permit it to connect with the service facility.

Figure 10:
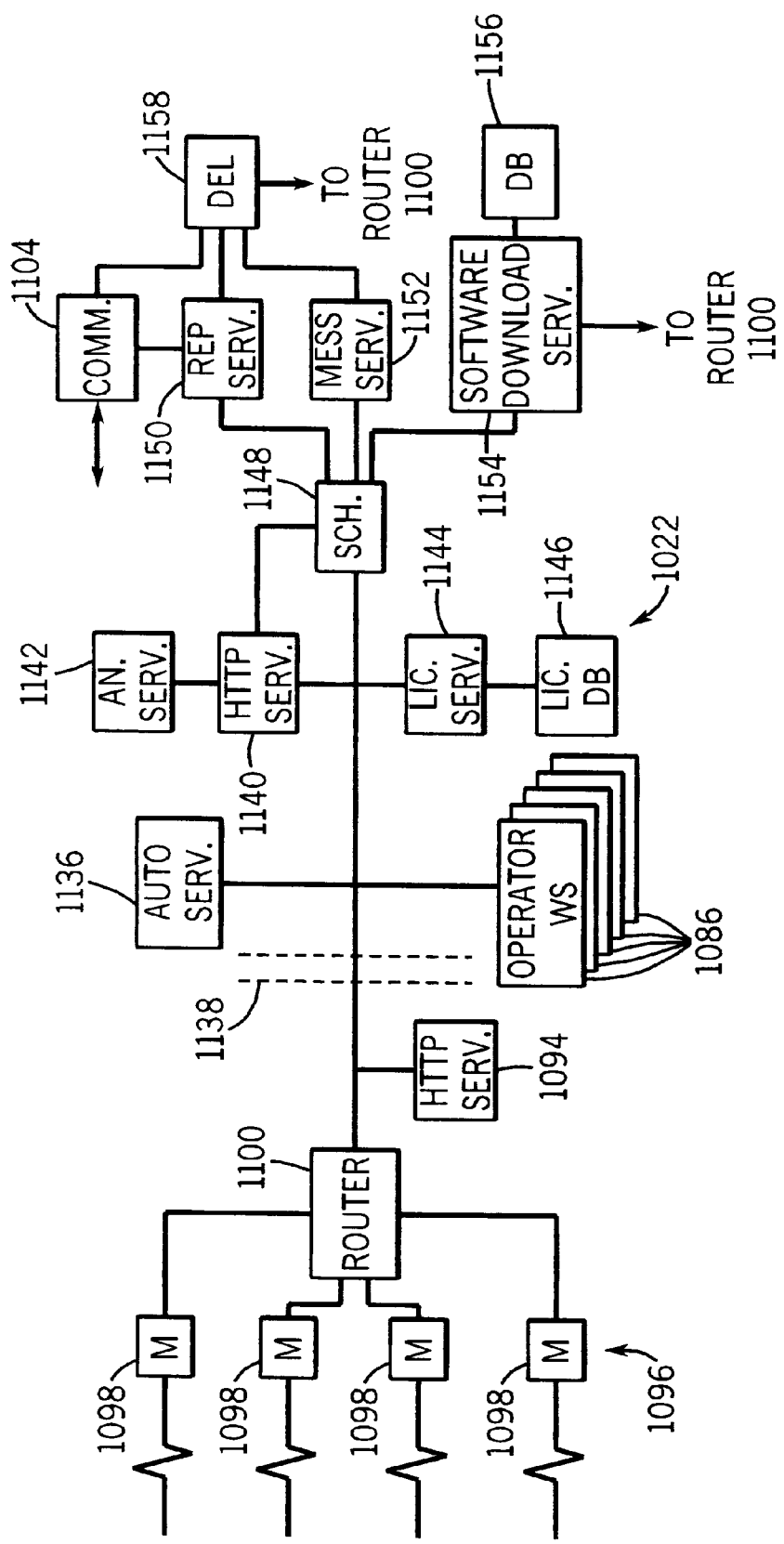
FIG. 10 is a block diagram of certain of the functional components of the service facility illustrated in FIG. 7 and FIG. 8 for rendering interactive remote service to a plurality of medical diagnostic systems.

FIG. 10 illustrates exemplary functional components for service facility 1022. As indicated above, service facility 1022 includes a modem rack 1096 comprising a plurality of modems 1098 coupled to a router 1100 for coordinating data communications with the service facility. An HTTP service server 1094 receives and directs incoming and outgoing transactions with the facility. Server 1094 is coupled to the other components of the facility through a firewall 1138 for system security. Operator workstations 1086 are coupled to the port manager for handling service requests and transmitting messages and reports in response to such requests.

An automated service unit 1136 may also be included in the service facility for automatically responding to certain service requests, sweeping subscribing diagnostic systems for operational parameter data, and so forth, as described below. In a presently preferred embodiment, the automated service unit may operate independently of or in conjunction with the interactive service components comprising processing system 1084. It should be noted that other network or communications schemes may be provided for enabling the service facility to communicate and exchange data and messages with diagnostic systems and remote service units, such as systems including outside Internet service providers (ISP's), virtual private networks (VPN's) and so forth.

Behind firewall 1138, an HTTP application server 1140 coordinates handling of service requests, messaging, reporting, software transfers and so forth. Other servers may be coupled to HTTP server 1140, such as service analysis servers 1142 configured to address specific types of service requests, as described more fully below. In the illustrated embodiment, processing system 1084 also includes a license server 1144 which is coupled to a license database 1146 for storing, updating and verifying the status of diagnostic system service subscriptions. Alternatively, where desired, license server 1144 may be placed outside of fire wall 1138 to verify subscription status prior to admission to the service facility.

Handling of service requests, messaging, and reporting is further coordinated by a scheduler module 1148 coupled to HTTP server 1140. Scheduler module 1148 coordinates activities of other servers comprising the processing system, such as a report server 1150, a message server 1152, and a software download server 1154. As will be appreciated by those skilled in the art, servers 1150, 1152 and 1154 are coupled to memory devices (not shown) for storing data such as addresses, log files, message and report files, applications software, and so forth. In particular, as illustrated in FIG. 10, software server 1154 is coupled via one or more data channels to a storage device database 1156 for containing transmittable software packages which may be sent directly to the diagnostic systems, accessed by the diagnostic systems, or supplied on pay-per-use or purchase basis. Message and report servers 1152 and 1150 are further coupled, along with communications module 1104, to a delivery handling module 1158, which is configured to receive outgoing messages, insure proper connectivity with diagnostic systems, and coordinate transmission of the messages.

In a presently preferred embodiment, the foregoing functional circuitry may be configured as hardware, firmware, or software on any appropriate computer platform. For example, the functional circuitry of the diagnostic systems may be programmed as appropriate code in a personnel computer or workstation either incorporated entirely in or added to the system scanner. The functional circuitry of the service facility may include additional personal computers or workstations, in addition to a main frame computer in which one or more of the servers, the scheduler, and so forth, are configured. Finally, the field service units may comprise personal computers or laptop computers of any suitable processor platform. It should also be noted that the foregoing functional circuitry may be adapted in a variety of manners for executing the functions described herein. In general, the functional circuitry facilitates the exchange of remote service data between the diagnostic systems and a remote service facility, which is preferably implemented in an interactive manner to provide regular updates to the diagnostic systems of service activities.

As described above, both the diagnostic systems and the field service units preferably facilitate interfacing between a variety of diagnostic system modalities and the remote service facility via a series of interactive user-viewable pages. Exemplary pages include capabilities of providing interactive information, composing service requests, selecting and transferring messages, reports and diagnostic system software, and so forth. Pages facilitate the interaction and use of remote services, such as, remote monitoring, remote system control, immediate file access from remote locations, remote file storage and archiving, remote resource pooling, remote recording, and remote high speed computations.

The user can access specific documents described in text areas of the pages by selection of all or a portion of the text describing the documents. In the presently preferred embodiment, the accessed documents may be stored in local memory devices within the diagnostic system, or selection of the text may result in loading of a uniform resource locator (URL) for accessing a remote computer or server via a network link.

Advantageously, service system 1010 (FIG. 7) provides remote services, such as, remote control, remote monitoring, remote diagnostics, remote servicing, and remote file storage. Service system 1010 incorporating the NMR imaging system described with reference to FIG. 1 provides for the remote viewing of images by off-site experts, upgrades of correction factors and algorithms from a remote facility, and applying the correction factor during reconstruction via a remote facility. As such, contractual arrangements or subscriptions may be arranged such that owners or leases of the imaging system can receive upgrades or service without expensive technician visits or recalibration exercises.

While the embodiments illustrated in the Figures and described above are presently preferred, it should be understood that the embodiments are offered by way of example only. Other embodiments may include enhanced remote services and features made possible by the networked systems described herein. The invention is not limited to a particular embodiment, but extends to various modifications, combinations, and permutations that nevertheless fall within the scope and spirit of the appended claims.

What is claimed is:

1. A system to correct edge blurring in an image reconstructed with partial k-space data comprising:

a magnetic resonance imaging system having a plurality of gradient coils positioned about a bore of a magnet to impress a polarizing magnetic field and an RF transceiver system and an RF modulator controlled by a pulse control module to transmit RF signals to an RF coil assembly to acquire MR images;

a computer programmed to:
  acquire a partial k-space data set having both magnitude and phase information;
  filter the partial k-space data set through high and low-pass filters and a linear combination of both the high and low-pass filters;
  Fourier transform the filtered data set;
  estimate a blurring correction factor representative of a convolution error term from a portion of the filtered data set; and
  apply the blurring correction factor to the filtered data set to remove the convolution error term and reconstruct an MRI preserving both magnitude and phase information while minimizing edge blurring in the reconstructed MRI; and a network coupled to any component of the magnetic resonance imaging system and the computer, the network providing communication with a remote facility for remote services.

2. The system of claim 1, wherein the remote services comprise performing upgrades of correction factors and algorithms from the remote facility.

3. The system of claim 1, wherein the remote services comprise viewing of the image at any of a variety of locations coupled to the network.

4. The system of claim 1, wherein the remote services comprise providing a subscription service to the magnetic resonance imaging system.

5. The system of claim 1, wherein the acquisition of partial k-space data set is approximately 75% to 80% of a full MRI data set and wherein the computer is further programmed to calculate a low frequency spatial phase and the application of the blurring correction factor further includes applying the low frequency spatial phase with the blurring correction factor to the filtered data set to remove the convolution error term.

6. The system of claim 5, wherein the computer is located at the remote facility.

7. The system of claim 1, wherein the partial k-space data set is filtered through first and second weighting factors, the first weighting factor defined as:

$$W_H(k) = \begin{cases} 0, k < -k_0 \\ 1, -k_0 \leq K \leq k_0 \\ 2, k > +k_0 \end{cases} ; \text{ and}$$

the second weighting factor defined as:

$$W_L(k) = \begin{cases} 1, -k_0 \leq k \leq k_0 \\ 0, \text{otherwise} \end{cases}$$

8. The system of claim 7, wherein the computer is further programmed to apply a third weighting factor to the partial k-space data set, the third weighting factor defined as:

$$W_{HH}(k) = \begin{cases} 1, k > k_0 \\ 0, \text{otherwise} \end{cases}$$

9. The system of claim 1, wherein the computer is programmed to initially Fourier transform the acquired k-space data set before the filtering step in a direction in which data is not absent, and then Fourier transform the filtered data set in a direction in which data is absent.

10. The system of claim 1, wherein the blurring correction factor estimation includes calculating a spatially varying phase and is further defined as:

$$\exp(j\phi_L(x)) = \frac{g_L(x)}{\|g_L(x)\|}$$

where $g_L(x)$ is the Fourier transform of the low-pass filtered data.

11. In a magnetic resonance imaging system, a method of phase sensitive magnetic resonance image (MRI) reconstruction using partial k-space data comprising the steps of:
    acquiring a partial k-space data set having both imaginary and real components containing both magnitude and phase information;
    communicating at least the partial k-space data set to a remote facility to provide remote services;
    filtering the partial k-space data set through high and low-pass filters and a linear construction of both;
    Fourier transforming the filtered data set;
    estimating a blurring correction factor representative of a convolution error term from a portion of the filtered data set;
    applying the blurring correction factor to the filtered data set to remove the convolution error term; and
    reconstructing an MRI having both magnitude and phase information thereby minimizing edge blurring in the reconstructed MRI.

12. The method of claim 11, wherein the step of acquiring the partial k-space data set is further defined as acquiring an MRI data set of approximately 75% to 80% of a full MRI data set and further comprising the step of calculating a low frequency spatial phase and wherein the step of applying the blurring correction factor further includes applying the low frequency spatial phase with the blurring correction factor to the filtered data set to remove the convolution error term.

13. The method of claim 11, wherein the step of estimating a blurring correction factor is accomplished with a weighting factor derived from a step filter.

14. The method of claim 11, wherein the step of filtering the partial k-space data set further includes applying a first weighting factor to the partial k-space data set, the first weighting factor defined as:

$$W_H(k) = \begin{cases} 0, k < -k_0 \\ 1, -k_0 \leq K \leq k_0 \\ 2, k > +k_0 \end{cases}$$

15. The method of claim 14, wherein the step of filtering the partial k-space data set further includes applying a second weighting factor to the partial k-space data set, the second weighting factor defined as:

$$W_L(k) = \begin{cases} 1, -k_0 \leq k \leq k_0 \\ 0, \text{otherwise} \end{cases}$$

16. The method of claim 14, wherein the step of filtering the partial k-space data set further includes applying a third weighting factor to the partial k-space data set, the third weighting factor defined as:

$$W_{HH}(k) = \begin{cases} 1, k > +k_0 \\ 0, \text{otherwise} \end{cases}$$

17. The method of claim 11, wherein the partial k-space data set is a high-fractional echo data set.

18. The method of claim 11, wherein the partial k-space data set is a partial NEX data set.

19. The method of claim 11, further comprising the step of initially Fourier transforming the acquired k-space data set before the filtering step in a direction in which data is not absent.

20. The method of claim 19, wherein the step of initially Fourier transforming the filtered data set is further defined as Fourier transforming the filtered data set in a direction in which data is absent.

21. The method of claim 11, wherein the step of estimating a blurring correction factor includes calculating a spatially varying phase and is further defined as:

$$\exp(j\phi_L(x)) = \frac{g_L(x)}{\|g_L(x)\|}$$

where $g_L(X)$ is the Fourier transform of the low-pass filtered data.

22. A system for minimizing edge blurring in a reconstructed magnetic resonance image (MRI) using partial k-space data comprising;
    means for acquiring partial k-space data containing both magnitude and phase components;
    means for communicating the partial k-space data to a remote facility to provide remote services;
    means for partially calculating a homodyne reconstructed MRI;
    means for retaining the phase component in the partially calculated homodyne reconstructed MRI; and
    means for removing a blurring error factor from the partially calculated homodyne reconstructed MRI wherein the partially calculated homodyne reconstructed MRI has both the phase component and a magnitude component therein with reduced MRI edge blurring.

23. The system of claim 22, wherein the means for acquiring is further defined as acquiring an MRI data set of approximately 75% to 80% of a full MRI data set, and further comprises a means for calculating a low frequency spatial phase and wherein the means for removing the blurring correction factor further includes applying the low frequency spatial phase with the blurring correction factor to the filtered data set to remove the convolution error term.

24. The system of claim 22, further comprising a means for estimating a blurring correction factor with a weighting factor derived from a step filter, and a means for filtering the partial k-space data set through a first weighting factor defined as:

$$W_H(k) = 2 - \frac{1}{1 + \exp((k - k_0)/ntrans)} - \frac{1}{1 + \exp((k + k_0)/ntrans)},$$

where ntrans is a transition width of a fermi distribution function.

25. The system of claim 24, wherein the means for filtering the partial k-space data set further includes applying a second weighting factor to the partial k-space data set, the second weighting factor defined as:

$$W_{HH}(k) = 1 - \frac{1}{1 + \exp((k - k_0)/ntrans)}.$$

26. The system of claim 22, further comprising a means for parallel processing at least three predefined subroutines, a first subroutine defined as applying a first low-pass filter to the partial k-space data, a second subroutine defined as applying a first high-pass filter to the partial k-space data, and a third subroutine defined as applying a linear combination of the high-pass and low-pass filters.

27. The system of claim 26, wherein the means for removing the blurring error factor combines each of the at least three parallel processed predefined subroutines for reducing edge blurring in an MRI while retaining both phase and magnitude representations in a reconstructed MRI.

* * * * *

UNITED STATES PATENT AND TRADEMARK OFFICE
CERTIFICATE OF CORRECTION

PATENT NO.    : 6,198,283 B1
DATED         : March 6, 2001
INVENTOR(S)   : Foo et al.

It is certified that error appears in the above-identified patent and that said Letters Patent is hereby corrected as shown below:

<u>Column 6,</u>
Line 49, change Equation [15a] from: "$=71_R(x)e^{j\Phi^L(x)} + f_{H(x)e}{}^{j\Phi^H(x)}$" to
-- $= f_L(x)e^{j\Phi L(x)} + f_H(x)e^{j\Phi H(x)}$ --.

Signed and Sealed this

Twelfth Day of February, 2002

Attest:

JAMES E. ROGAN
*Attesting Officer*      *Director of the United States Patent and Trademark Office*